United States Patent
Eiermann et al.

(10) Patent No.: US 8,841,909 B2
(45) Date of Patent: Sep. 23, 2014

(54) BALANCED-TO-UNBALANCED TRANSFORMER FOR CONVERTING A SYMMETRICAL HIGH-FREQUENCY SIGNAL INTO AN ASYMMETRICAL HIGH-FREQUENCY SIGNAL

(75) Inventors: Franz Eiermann, Rattelsdorf-Ebing (DE); Klaus Huber, Effeltrich (DE)

(73) Assignee: Siemens Aktiengesellschaft, München (DE)

( * ) Notice: Subject to any disclaimer, the term of this patent is extended or adjusted under 35 U.S.C. 154(b) by 448 days.

(21) Appl. No.: 13/270,034

(22) Filed: Oct. 10, 2011

(65) Prior Publication Data

US 2012/0262177 A1    Oct. 18, 2012

(30) Foreign Application Priority Data

Oct. 11, 2010    (DE) .................... 10 2010 042 280

(51) Int. Cl.
    *G01V 3/00* (2006.01)
(52) U.S. Cl.
    USPC ........................................ 324/318; 324/322
(58) Field of Classification Search
    USPC ................ 324/300–322; 600/409–446
    See application file for complete search history.

(56) References Cited

U.S. PATENT DOCUMENTS

| | | | |
|---|---|---|---|
| 5,923,237 A | 7/1999 | Sato et al. | |
| 6,844,730 B2 | 1/2005 | Feld et al. | |
| 2003/0076105 A1 | 4/2003 | Feld et al. | |
| 2013/0176401 A1* | 7/2013 | Monari et al. | 348/47 |

FOREIGN PATENT DOCUMENTS

| DE | 101 48 467 A1 | 4/2003 |
|---|---|---|
| JP | 2009-252845 | 10/2009 |

OTHER PUBLICATIONS

German Office Action dated Jun. 30, 2011 for corresponding German Patent Application No. DE 10 2010 042 280.0 with English translation.

* cited by examiner

*Primary Examiner* — Brij Shrivastav
(74) *Attorney, Agent, or Firm* — Lempia Summerfield Katz LLC

(57) ABSTRACT

The present embodiments relate to a balanced-to-unbalanced transformer for converting a symmetrical high-frequency signal into an asymmetrical high-frequency signal. The balanced-to-unbalanced transformer includes two coil windings made of wire. The two coil windings are electrically insulated from each other and are wound on a winding form. Each of the two coil windings has an input at one end of the winding form for the symmetrical high-frequency signal and an output at another end of the winding form for the asymmetrical high-frequency signal. The two coil windings lie on top of one another in a radial direction of the winding form.

20 Claims, 2 Drawing Sheets

BALANCED-TO-UNBALANCED TRANSFORMER FOR CONVERTING A SYMMETRICAL HIGH-FREQUENCY SIGNAL INTO AN ASYMMETRICAL HIGH-FREQUENCY SIGNAL

This application claims the benefit of DE 10 2010 042 280.0, filed on Oct. 11, 2010.

BACKGROUND

The present embodiments relate to a balanced-to-unbalanced transformer for converting a symmetrical high-frequency signal into an asymmetrical high-frequency signal.

Balanced-to-unbalanced transformers are symmetrical arrangements (e.g., baluns) that are employed in a plurality of technical application areas. In this role, one task of a balun is to suppress unwanted common-mode excitation occurring during the conversion of the symmetrical high-frequency signal into the asymmetrical high-frequency signal to the greatest extent possible in order to avoid, for example, standing waves during a transmission over a coaxial cable. In the field of magnetic resonance tomography, baluns are employed without the use of ferrites (e.g., in receiving devices for high-frequency signals). Information about the tissue examined using the tomography system is derivable from the high-frequency signals. High-frequency signals in the 500 MHz range and below may be processed in magnetic resonance tomography systems. The large wavelengths resulting herefrom impose large demands in terms of space requirements and consequently on the feasibility of employing baluns in discrete circuits.

A balanced-to-unbalanced transformer may be implemented in the form of a two-wire line, in which two coil windings electrically insulated from each other are wound side by side on a winding form. Due to the inductance of the individual windings and a parasitic capacitance resulting on account of the spacing between turns of the individual winding, a resonant circuit is formed. The resonant frequency of the resonant circuit may correspond to a frequency of the high-frequency signal that is to be converted. In such an arrangement, the two conductors of the coil windings for the differential-mode excitation act as a parallel wire system that, except for ohmic conductor losses, has no effect on the transmission of the differential-mode signal. For the common-mode excitation at the resonant frequency, in contrast, the balun acts as a parallel resonant circuit. A finite quality of the parallel resonant circuit determines the degree of common-mode suppression.

SUMMARY AND DESCRIPTION

The present embodiments may obviate one or more of the drawbacks or limitations in the related art. A balanced-to-unbalanced transformer for converting a symmetrical high-frequency signal into an asymmetrical high-frequency signal is provided.

The balanced-to-unbalanced transformer according to the present embodiments includes two coil windings made of wire that are electrically insulated from each other and are wound on a winding form, each of the coil windings having an input at one end of the winding form for the symmetrical high-frequency signal and an output at the other end of the winding form for the asymmetrical high-frequency signal. One embodiment of the balanced-to-unbalanced transformer, which may not include ferrites or a ferrite core, is characterized in that the coil windings lie on top of one another in a radial direction of the winding form. The winding form, which may consist of electrically insulating material (e.g., plastic), is assigned a longitudinal direction, in which the coil windings extend from one end of the winding form to the other end of the winding form. Radial direction may be understood to be an extension direction normal to the longitudinal direction. In one embodiment, the winding form is embodied as cylindrical, although where appropriate, other shapes of the winding form (e.g., elliptical or cuboidal winding forms) may be used.

The balanced-to-unbalanced transformer according to the present embodiments has the advantage that the length of the winding form may be reduced substantially in comparison with conventional balanced-to-unbalanced transformers having coil windings arranged adjacent to one another on the winding form.

In one embodiment, an individual coil winding is wound substantially without spacing between adjacent turns of the respective coil winding. In other words, wires of a coil winding are arranged immediately next to one another, which provides that the length of the winding form may be at least halved compared with conventional baluns. The inductance of the individual windings and hence the number of turns of the respective coil winding may be reduced, since the parasitic capacitance of the respective winding is increased as a result of wires that lie directly next to one another. In another embodiment, the wire of one coil winding is wound in parallel on the wire of the other coil winding, thereby providing simple production of the balanced-to-unbalanced transformer according to the present embodiments.

The balanced-to-unbalanced transformer according to the present embodiments serves, for example, for converting high-frequency signals in a lower frequency range and for processing high-frequency signals in a magnetic resonance tomography system. The balanced-to-unbalanced transformer may be configured for common-mode suppression of high-frequency signals having a frequency between 10 MHz and 500 MHz. In one embodiment, values for the inductance of a particular coil winding lie in the range between 1 μH and 10 μH.

In one embodiment of the balanced-to-unbalanced transformer, in order to implement particularly efficient common-mode suppression in the aforementioned frequency range, the resonant frequency of the resonant circuit that is formed by the inductor of an individual coil winding and a parasitic capacitor between the turns of the respective coil winding lies in the range between 10 MHz and 500 MHz.

In another embodiment of the balanced-to-unbalanced transformer, the winding form has a length between 3 mm and 10 mm (e.g., a length of 5 mm). If a cylindrical winding form is used, the diameter of the cylindrical winding form may be between 2 mm and 10 mm (e.g., about 4 mm).

The number of turns of an individual coil winding may vary according to the frequency of the high-frequency signal that is to be converted. For example, the respective coil winding may have 20 to 60 turns (e.g., 40 turns).

The wire used for an individual coil winding may be, for example, an insulated copper wire having a diameter between 50 and 100 μm (e.g., 80 μm). The insulation may be obtained using an insulating varnish coating on the wire.

In addition to the above-described balanced-to-unbalanced transformer, the present embodiments also include a receiving device for a high-frequency signal (e.g., for a magnetic resonance tomography system). The receiving device includes the balanced-to-unbalanced transformer according to the present embodiments, an antenna for wireless reception of a symmetrical high-frequency signal, and a coaxial cable for forwarding an asymmetrical high-frequency signal. In this arrangement, the antenna is connected to inputs of the coil windings of the balanced-to-unbalanced transformer. In contrast, the output of one coil winding of the balanced-to-unbalanced transformer is connected to an inner conductor of the coaxial cable, and the output of the other coil winding of the balanced-to-unbalanced transformer is connected to an outer conductor of the coaxial cable. In one embodiment, the antenna of the receiving device is a loop antenna that, for example, has a diameter in the range of several centimeters (e.g., 10 cm). In another embodiment of the receiving device, a preamplifier is connected between the antenna and the balanced-to-unbalanced transformer. In one embodiment, the balanced-to-unbalanced transformer is part of a preamplifier that first amplifies the symmetrical high-frequency signal and feeds the amplified symmetrical high-frequency signal to the balanced-to-unbalanced transformer.

The present embodiments also relate to a magnetic resonance tomography system that includes one or more of the above-described receiving devices.

DETAILED DESCRIPTION OF THE DRAWINGS

In the figures described hereinbelow, the present embodiments are explained with reference to a wireless receiving device for a high-frequency signal that is contained in a magnetic resonance tomography system (e.g., tomography system). The wireless receiving device receives the high-frequency signal, which results within a body being examined in response to a high-frequency excitation pulse. The high-frequency signal is evaluated in a corresponding evaluation device for the purpose of analyzing tissue of a patient placed in the tomography system. Magnetic resonance tomography is an imaging method, in which the tissue to be examined is exposed to a strong magnetic field, using which nuclear spins of individual atoms are aligned in the tissue. As a result of the above-described external excitation using a high-frequency pulse, a measurable oscillation that is recorded by the receiving device is generated.

Figure 1:
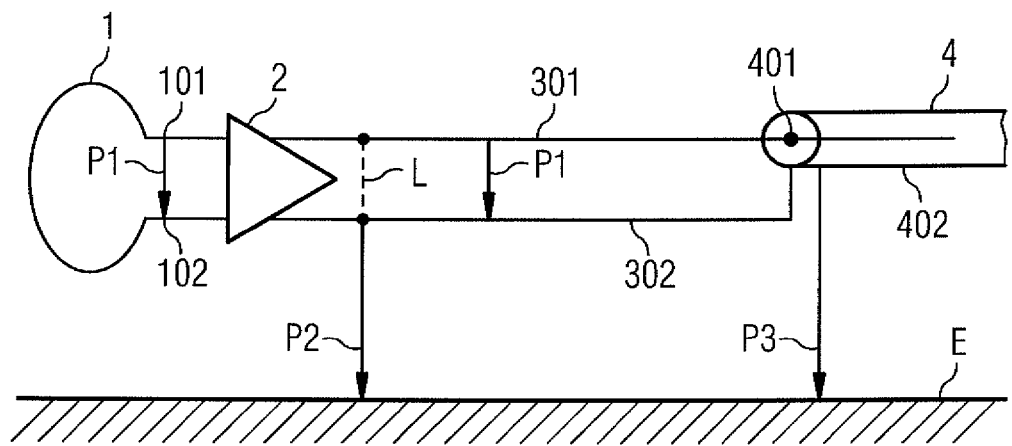
FIG. 1 shows a wireless receiving device for a high-frequency signal without the use of a balun.

FIG. 1 shows an example of a receiving device for use in a magnetic resonance tomography system. The receiving device is integrated, for example, in a bed or support for the patient to be examined and contains no balanced-to-unbalanced transformer or balun. The receiving device includes a loop antenna 1, via which a symmetrical high-frequency signal is received over lines 101 and 102. The high-frequency signal is amplified in a preamplifier 2 and passes via lines 301 and 302 to an asymmetrical two-conductor system in the form of a coaxial conductor 4 with inner conductor 401 and outer conductor 402. The symmetrical high-frequency signal includes a differential-mode signal or differential-mode excitation that represents an inversely phased signal between the lines 101 and 102 or following the preamplification, between the lines 301 and 302. The differential-mode excitation is indicated in FIG. 1 by arrow P1. The signal also includes an unwanted common-mode wave that is represented as a virtual short-circuit to ground E (indicated by hatching) via dashed line L and arrow P2. On the asymmetrical coaxial cable 4, the common-mode excitation leads to interference in the form of a standing wave, as indicated by arrow P3 between outer conductor 402 and the ground E.

Figure 2:
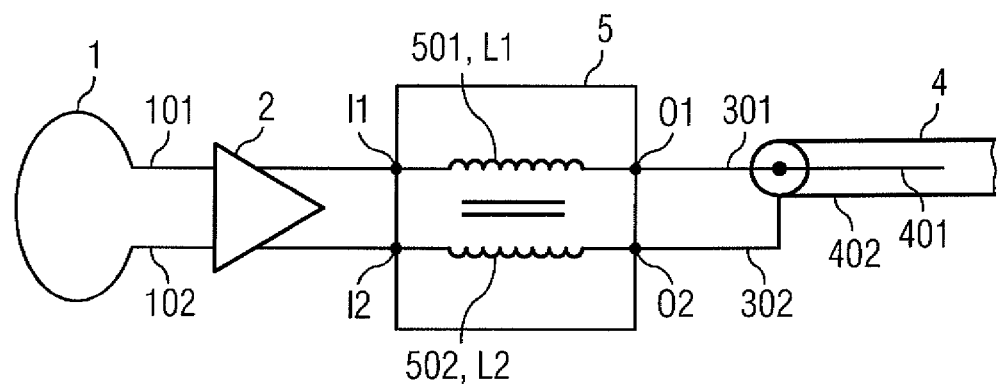
FIG. 2 shows a wireless receiving device for a high-frequency signal including one embodiment of a balun in a first operating mode.

In order to realize common-mode suppression, a balanced-to-unbalanced transformer or balun according to the present embodiments is connected into the lines 301 and 302, as illustrated in FIG. 2. The diagram shown in FIG. 2 largely corresponds to that in FIG. 1, so the same reference signs are used to denote like components that will not be described a second time. In contrast to FIG. 1, one embodiment of the receiving device according to FIG. 2 includes a balun 5 in the form of two parallel-wound coils 501 and 502 (e.g., coil windings, coils), an inductor of the coil 501 being labeled with L1 and an inductor of the coil 502 being labeled with L2. Inputs of the coils 501 and 502 are labeled with I1 and I2, respectively, and outputs of the coils 501 and 502 are labeled by O1 and O2, respectively. The mechanical design of the balun is different from conventional baluns, as is explained further below with reference to FIG. 3.

The electrical characteristics of the coil windings 501 and 502 are essentially the same (e.g., the inductors L1 and L2 are essentially the same size). The impedance of the inductors L1 and L2 at an operating frequency (e.g., at a frequency of signals received via the loop antenna 1) is much greater than a line impedance of the coaxial cable 4 (e.g., 50Ω). For the purposes of common-mode transmission, this results in a large resistance being generated, which provides a high level of common-mode suppression and consequently acts as a standing wave trap. For the differential-mode transmission, in contrast, the balun represents a wound line, since the inductors L1 and L2 have no effect on the differential-mode transmission.

Figure 3:
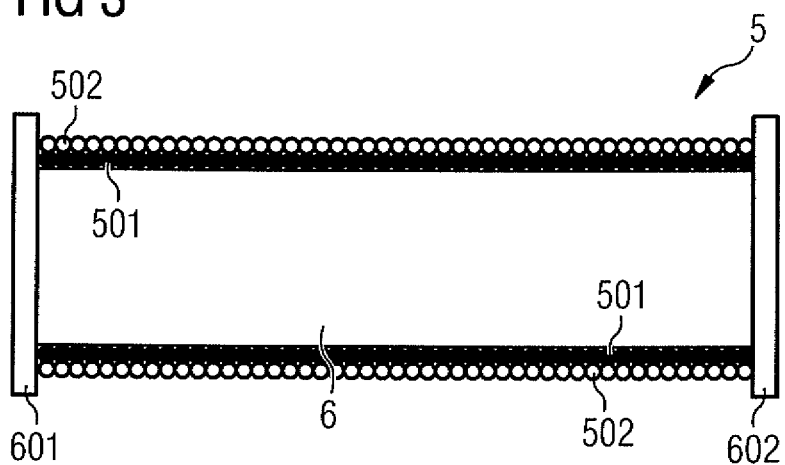
FIG. 3 is a sectional view that shows the mechanical design of one embodiment of the balun.

FIG. 3 shows a longitudinal section through the balun 5 according to FIG. 2. The balun 5 is embodied as a wound two-wire system. The balun 5 according to FIG. 3 includes a cylindrical winding form 6 (e.g., a winding form) having a first end 601 and a second end 602. In this arrangement, the inputs I1 and I2 of the respective coils 501 and 502 are provided at an end 601, whereas the outputs O1 and O2 of the respective coils are located at an end 602. The inputs I1 and I2 and the outputs O1 and O2 are not shown in FIG. 3. The lines of the coil windings 501 and 502 may, for example, be embodied as copper wire that has an insulating varnish coating.

Wound first on the cylindrical winding form 6 is the coil 501, the wires of which are indicated in the sectional view as black dots. The coil winding 502, the wires of which are indicated by white dots, is not wound next to the coil winding 501 on the winding form 6, which would lead to the wires represented by black and white dots in FIG. 3 alternating in the longitudinal direction of the winding form 6 and hence lying adjacent to one another on the winding form 6. Instead, the coil winding 501 is positioned on the coil winding 502 (e.g., the coil windings 501 and 502 are arranged one on top of the other in a radial direction of the winding form 6). As a result, an installation size of the balun 5 may be significantly shortened, since a winding form that is half as long is used for the windings of the two coils 501 and 502. With conventional baluns for use in magnetic resonance tomography, the length of the winding form is, for example, in the region of 10 mm and accordingly may be shortened to 5 mm in the balun according to the present embodiments. This leads to a significant reduction in the size of the balun.

Figure 4:
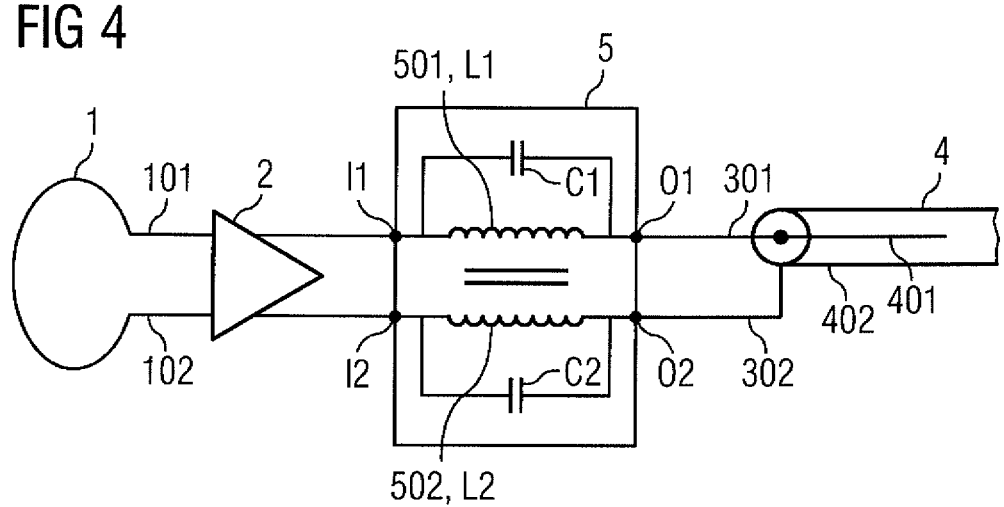
FIG. 4 shows the wireless receiving device of FIG. 2 including one embodiment of the balun in a second operating mode.

FIG. 4 shows a receiving device for a magnetic resonance tomography system in one embodiment of an operating mode. The layout of the receiving device according to FIG. 4 corresponds to the layout of the receiving device according to FIG. 2 and the same reference signs are used to describe the same or similar components. For illustration purposes, parasitic capacitors C1 and C2 embodied between turns of the coils 501 and 502, respectively, are additionally indicated in FIG. 4. The parasitic capacitors C1 and C2 lie in the picofarad range. Like the inductors L1 and L2, the parasitic capacitors C1 and C2 are essentially equal in size. In the receiving device of FIG. 4, the balun 5 is configured such that the resonance of respective resonant circuits composed of inductor L1 and capacitor C1 or inductor L2 and capacitor C2 corresponds to the operating frequency of the high-frequency signal received via the loop antenna 1. Depending on a resonant circuit quality for the operating frequency, the impedance may be increased considerably in common-mode operation as compared with the impedance in the receiving device of FIG. 2. For the differential-mode transmission, the balun represents a coiled line.

Efficient suppression of unwanted common-mode excitation in the conversion of a symmetrical high-frequency signal into an asymmetrical high-frequency signal is achieved using the balun according to the present embodiments. The installation size of the balun is significantly reduced compared with conventional baluns, since the windings of the coils of the balun are no longer arranged adjacent to one another on the winding form, but on top of one another, thereby shortening the length of the winding form. The balun according to the present embodiments may be employed in a receiving device of a magnetic resonance tomography system, although use of the balun is not restricted to this field of application. The balun may also be used where appropriate in other receiving devices.

Figure 5:
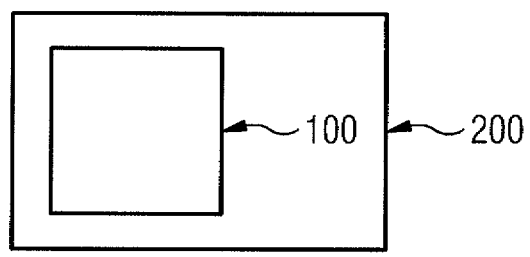
FIG. 5 shows one embodiment of a magnetic resonance tomography system having one embodiment of a receiving device according to FIG. 2.

The receiving device described hereintofore with reference to FIGS. 2 and 4 is, for example, part of one embodiment of a magnetic resonance tomography system 200, as shown in FIG. 5 (in the diagram according to FIG. 5, the receiving device is labeled with the reference sign 100). The receiving device is integrated, for example, in the couch for the patient to be examined.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A balanced-to-unbalanced transformer for converting a symmetrical high-frequency signal into an asymmetrical high-frequency signal, the balanced-to-unbalanced transformer comprising:
    two coil windings made of wire, the two coil windings being electrically insulated from each other and being wound on a winding form, each of the two coil windings having an input at one end of the winding form for the symmetrical high-frequency signal and an output at another end of the winding form for the asymmetrical high-frequency signal,
    wherein the two coil windings lie on top of one another in a radial direction of the winding form.

2. The balanced-to-unbalanced transformer as claimed in claim 1, wherein each of the two coil windings is wound substantially without spacing between adjacent turns.

3. The balanced-to-unbalanced transformer as claimed in claim 1, wherein the wire of one coil winding of the two coil windings is wound in parallel on the wire of the other coil winding of the two coil windings.

4. The balanced-to-unbalanced transformer as claimed in claim 1, wherein an inductor of each coil winding of the two coil windings has an inductance in the range between 1 µH and 10 µH.

5. The balanced-to-unbalanced transformer as claimed in claim 4, wherein the resonant frequency of resonant circuits that are formed by the inductors of the coil windings and parasitic capacitance between turns of the coil windings lie in a range between 10 MHz and 500 MHz.

6. The balanced-to-unbalanced transformer as claimed in claim 1, wherein the winding form has a length between 3 mm and 10 mm.

7. The balanced-to-unbalanced transformer as claimed in claim 1, wherein each of the two coil windings comprises 20 to 60 turns.

8. The balanced-to-unbalanced transformer as claimed in claim 1, wherein the wire of the two coil windings is an insulated copper wire having a diameter between 50 and 100 µm.

9. The balanced-to-unbalanced transformer as claimed in claim 6, wherein the length of the winding form is 5 mm.

10. The balanced-to-unbalanced transformer as claimed in claim 1, wherein the winding form is cylindrical and has a diameter between 2 mm and 10 mm.

11. The balanced-to-unbalanced transformer as claimed in claim 1, wherein the diameter of the winding is 4 mm.

12. The balanced-to-unbalanced transformer as claimed in claim 6, wherein the winding form is cylindrical and has a diameter between 2 mm and 10 mm.

13. The balanced-to-unbalanced transformer as claimed in claim 1, wherein each of the two coil windings comprises 40 turns.

14. The balanced-to-unbalanced transformer as claimed in claim 8, wherein the diameter of the wire is 80 µm.

15. A receiving device for a high-frequency signal for a magnetic resonance tomography system, the receiving device comprising:
    a balanced-to-unbalanced transformer for converting a symmetrical high-frequency signal into an asymmetrical high-frequency signal, the balanced-to-unbalanced transformer comprising:
        two coil windings made of wire, the two coil windings being electrically insulated from each other and being wound on a winding form, each of the two coil windings having an input at one end of the winding form for the symmetrical high-frequency signal and an output at another end of the winding form for the asymmetrical high-frequency signal, wherein the two coil windings lie on top of one another in a radial direction of the winding form;
    an antenna for wireless reception of the symmetrical high-frequency signal; and
    a coaxial cable for forwarding the asymmetrical high-frequency signal, the antenna being connected to inputs of the two coil windings, an output of one coil winding of the two coil windings being connected to an inner conductor of the coaxial cable, and an output of the other coil winding of the two coil windings being connected to an outer conductor of the coaxial cable.

16. The receiving device as claimed in claim 15, wherein the antenna comprises a loop antenna.

17. The receiving device as claimed in claim 15, wherein a preamplifier is connected between the antenna and the balanced-to-unbalanced transformer.

18. The receiving device as claimed in claim 16, wherein a preamplifier is connected between the antenna and the balanced-to-unbalanced transformer.

19. A magnetic resonance tomography system comprising:
   one or more receiving devices for a high-frequency signal for a magnetic resonance tomography system, each of the one or more receiving devices comprising:
   a balanced-to-unbalanced transformer for converting a symmetrical high-frequency signal into an asymmetrical high-frequency signal, the balanced-to-unbalanced transformer comprising:
   two coil windings made of wire, the two coil windings being electrically insulated from each other and being wound on a winding form, each of the two coil windings having an input at one end of the winding form for the symmetrical high-frequency signal and an output at another end of the winding form for the asymmetrical high-frequency signal, wherein the two coil windings lie on top of one another in a radial direction of the winding form;
   an antenna for wireless reception of the symmetrical high-frequency signal; and
   a coaxial cable for forwarding the asymmetrical high-frequency signal, the antenna being connected to inputs of the two coil windings, an output of one coil winding of the two coil windings being connected to an inner conductor of the coaxial cable, and an output of the other coil winding of the two coil windings being connected to an outer conductor of the coaxial cable.

20. The receiving device as claimed in claim 19, wherein the antenna comprises a loop antenna.

\* \* \* \* \*